United States Patent
Rountree et al.

[11] Patent Number: 5,977,596
[45] Date of Patent: *Nov. 2, 1999

[54] DEPLETION CONTROLLED ISOLATION STAGE

[75] Inventors: Robert Rountree; Charvaka Duvvury, both of Plano, Tex.; Tatsuroh Maki, Ami-Machi, Japan

[73] Assignee: Texas Instruments Incorporated, Dallas, Tex.

[*] Notice: This patent is subject to a terminal disclaimer.

[21] Appl. No.: 09/182,361

[22] Filed: Oct. 29, 1998

Related U.S. Application Data

[63] Continuation of application No. 08/109,203, Aug. 19, 1993, Pat. No. 5,925,922, which is a continuation of application No. 07/977,730, Nov. 16, 1992, abandoned, which is a continuation of application No. 07/767,737, Sep. 30, 1991, abandoned.

[51] Int. Cl.$^6$ ............................................. H01L 23/62
[52] U.S. Cl. .......................... 257/363; 257/356; 361/100
[58] Field of Search ..................................... 257/360, 356, 257/363; 361/56, 91, 98, 100, 101

[56] References Cited

U.S. PATENT DOCUMENTS

| | | | |
|---|---|---|---|
| 4,710,791 | 12/1987 | Shirato et al. | 257/363 |
| 4,821,096 | 4/1989 | Maloney | 327/427 |
| 4,939,616 | 7/1990 | Rountree | 361/56 |
| 5,010,380 | 4/1991 | Avery | 361/91 |
| 5,012,317 | 4/1991 | Rountree | 257/173 |
| 5,019,888 | 5/1991 | Scott et al. | 257/698 |
| 5,270,565 | 12/1993 | Lee et al. | 257/358 |
| 5,594,265 | 1/1997 | Shimizu et al. | 257/355 |

FOREIGN PATENT DOCUMENTS

| | | |
|---|---|---|
| 0 324 185 | 7/1989 | European Pat. Off. . |
| 56-067963 | 6/1981 | Japan . |
| 59-218764 | 12/1984 | Japan . |
| 59-228751 | 12/1984 | Japan . |
| 62-101067 | 5/1987 | Japan . |

OTHER PUBLICATIONS

"A COMS VSLI ESD Input Protection Device, DIFIDW", *Electrical Overstress/Electrostatic Discharge Symposium Proceedings*, Digital Equipment Corp., Hudson, Mass., 1984, pp. 202–209.

"Doping of N+ and P+ Polysilicon in a Dual–Gate CMOS Process", Wong, et al., *IEEE*, 1988, pp. 238–241.

"Effect of Silicon–Gate Resistance on the Frequency Response of MOS Transistors", Lin, et al., *IEEE Transactions on Electron Devices*, May 1975, pp. 255–264.

"Ion–Implanted Semiconductor Devices", Lee, et al., *Proceedings of the IEEE*, No. 9, Sep. 1974, pp. 1241–1255.

*Primary Examiner*—Jerome Jackson, Jr.
*Assistant Examiner*—George C. Eckert, II
*Attorney, Agent, or Firm*—Robert N. Rountree; Robby T. Holland; Richard L. Donaldson

[57] ABSTRACT

An input protection device is presented having a depletion controlled isolation stage. In one embodiment of the invention, a depletion controlled isolation resistor is formed between adjacent N+ diffused regions by N-well diffusion. One N+ diffused region electrically contacts an input bond pad and a primary protective device. The other N+ diffused region electrically contacts a second protective device and the internal circuit it is to protect. The depletion controlled isolation resistor limits the amount of current passing through the resistor to a safe level during an over-voltage condition. In another embodiment of the invention, a depletion controlled isolation stage includes a silicon controlled rectifier (SCR) as the primary protective device in combination with the depletion controlled isolation resistor.

11 Claims, 8 Drawing Sheets

DEPLETION CONTROLLED ISOLATION STAGE

This application is a continuation of Ser. No. 08/109,203 filed Aug. 19, 1993 now U.S. Pat. No. 5,925,922 which is a continuation of Ser. No. 07/977,730 filed Nov. 16, 1992 now abandoned which is a continuation of Ser. No. 07/767,737 filed Sep. 30, 1991 now abandoned.

FIELD OF THE INVENTION

The present invention relates to the field of input protection circuitry for sensitive electrical devices such as integrated circuitry. More specifically, the present invention relates to the field of protection of over-voltage conditions such as in electrostatic discharge situations.

BACKGROUND OF THE INVENTION

Input protection circuitry is an essential part of modern integrated circuits, particularly in the area of field effect transistor based devices. Extremely small delicate device structures are very sensitive to high voltages. The threat of high voltage damage begins during fabrication of integrated circuits into products and continues throughout the service life of the integrated circuits.

High voltage damage from electrostatic discharge may occur during installation of integrated circuits into products. Sources of electrostatic charge include the human body, within which charge is generated, and installation tools having residual charge. Electrostatic charge may be transferred to integrated circuits through physical contact. Subsequent to installation, high voltage damage is usually the result of a power surge. These high voltages may destroy integrated circuits, thus requiring expensive and tedious repairs on fully manufactured devices which could have been avoided by providing a mechanism for dissipation of the high voltage on the integrated circuit. This problem is particularly acute in complimentary metal oxide semiconductor field effect transistor type integrated circuits. In high density CMOS devices, an extremely high voltage may be developed by electrostatic discharge which easily destroys the very thin gate oxides and very short channel devices of the integrated circuit.

One way to protect against these over-voltage conditions is to use a silicon controlled rectifier (SCR) structure compatible with complementary metal oxide semiconductor (CMOS). This structure is shown in application Ser. No. 07/213,499, filed Jun. 27, 1988 and assigned to the assignee of this application. This structure provides excellent protection but the SCR protection device has a very high threshold voltage. This threshold voltage is commonly on the order of 70–80 volts. It has been found in many present day circuits that a 70–80 volt threshold is inadequate to protect some devices on the integrated circuit. Another input protection structure which greatly reduces the threshold voltage of the input protection is shown in U.S. Pat. No. 4,939,616, assigned to the assignee of this application, which shows an input protection device with a low trigger threshold. This structure is a silicon controlled rectifier (SCR) type of device wherein the triggering mechanism is avalanche conduction at the interface between the N-well surrounding a portion of the protection device and the P-type substrate.

Therefore, while input protection structures exist, it is highly desirable to provide an input protection structure which greatly increases the over-voltage protection that is available in present input protection structures.

SUMMARY OF THE INVENTION

The described embodiments of the present invention provide an input protection device with a depletion controlled isolation stage. In one embodiment of the invention, a depletion controlled isolation resistor is formed between adjacent N+ diffused regions by N-well diffusion. One N+ diffused region electrically contacts an input bond pad and a primary protective device. The other N+ diffused region electrically contacts a second protective device and the internal circuit it is to protect. The depletion controlled isolation resistor limits the amount of current passing through the resistor to a safe level during an over-voltage condition. An over-voltage condition includes electrostatic discharges and power surges.

In another embodiment of the invention, a depletion controlled isolation stage includes a silicon controlled rectifier (SCR) as the primary protective device in combination with the depletion controlled isolation resistor. The triggering mechanism of the SCR is avalanche conduction at the interface between the N+ region at the input surrounding a portion of the protection device and the P-type substrate. Of course, opposite doping types may be effectively used from those disclosed in the described embodiments.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE INVENTION

Figure 1:
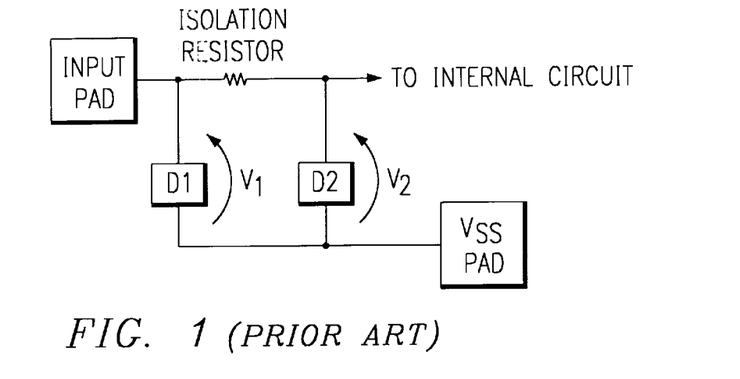
FIG. 1 is a schematic diagram of a prior art input protection circuit.

FIG. 1 shows a prior art two stage input protection circuit consisting of a primary discharge device D1, an isolation resistor and a small clamping device D2. In order to protect the internal circuit, device D2 must clamp at voltage V2 which is sore value below the gate dielectric rupture threshold. Device D2 must continue to sink current during an electrostatic discharge ESD event until a sufficient voltage is developed across the isolation resistor to cause device D1 to turn on at voltage V1. For advanced processes, however, typical values of V1=25v, V2=15v and isolation resistance= 100 ohms result in the isolation resistor conducting up to 100 mA for up to 20 nS. This may lead to premature failure of the isolation resistor before the full potential of primary protection device D1 is achieved.

FIGS. 2–5 are various embodiments of the invention having an N-well isolation resistor 10. The embodiments of FIGS. 2–5 all include a semiconductor substrate 12 and a lightly doped N-well 14 formed in substrate 12. In the embodiment shown in FIG. 2, heavily doped N+ regions 16 and 18 are formed within N-well 14 with region 16 being laterally spaced from region 18. Region 16 is electrically connected to an input bond pad 20. Region 18 is connected to a circuit structure 21 that is to be protected.

Figure 3:
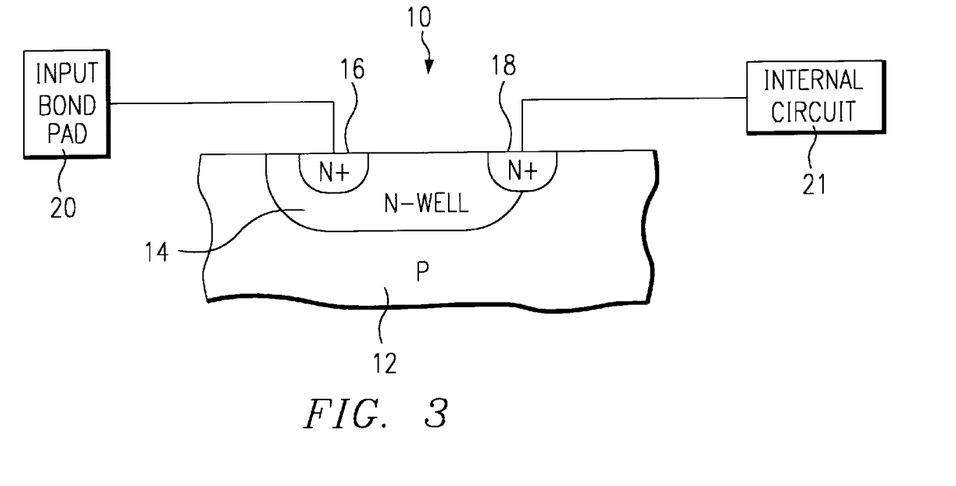
FIG. 3 is a side view schematic diagram of another embodiment of the present invention.

In the embodiment shown in FIG. 3, heavily doped N+ region 16 is formed within N-well 14. Heavily doped N+ region 18 is formed at an intersection of N-well 14 and substrate 12. Region 16 is electrically connected to an input bond pad 20. Region 18 is connected to a circuit structure 21 that is to be protected.

Figure 4:
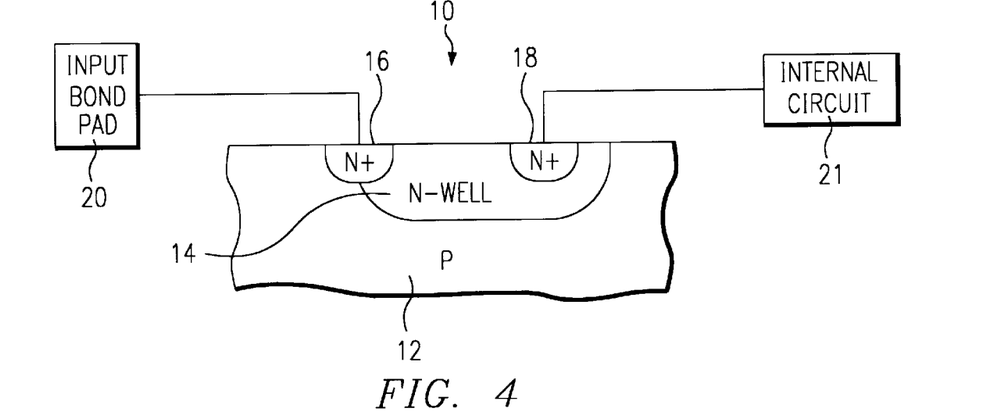
FIG. 4 is a side view schematic diagram of yet another embodiment of the present invention.

In the embodiment shown in FIG. 4, heavily doped N+ region 16 is formed at an intersection of N-well 14 and substrate 12. Heavily doped N+ region 18 is formed within N-well 14. Region 16 is electrically connected to an input bond pad 20. Region 18 is connected to a circuit structure 21 that is to be protected.

Figure 5:
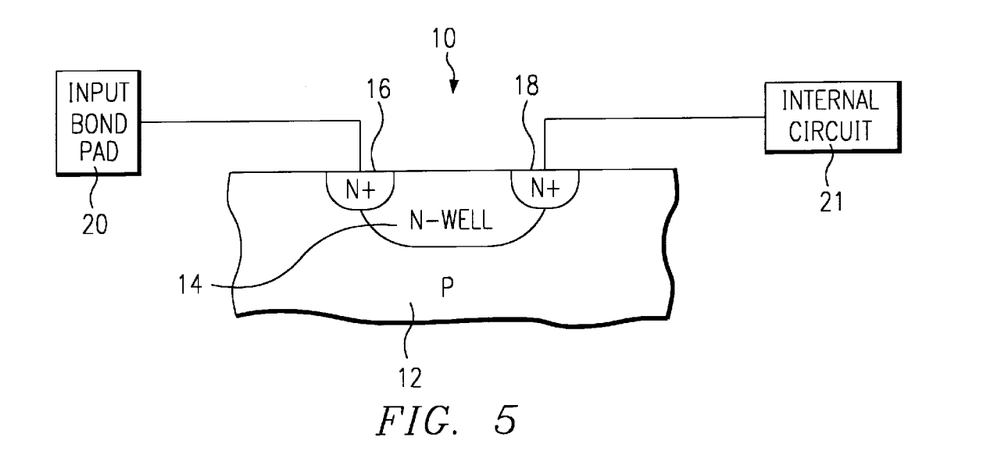
FIG. 5 is a side view schematic diagram of still another embodiment of the present invention.

In the embodiment shown in FIG. 5, heavily doped N+ region 16 is formed at an intersection of N-well 14 and substrate 12. Heavily doped N+ region 18 is also formed at an intersection of N-well 14 and substrate 12. Region 16 is electrically connected to an input bond pad 20. Region 18 is connected to a circuit structure 21 that is to be protected. In the device of FIGS. 2–5 resistance is provided by the resistive nature of N-well 14 between heavily doped regions 16 and 18.

Figure 6:
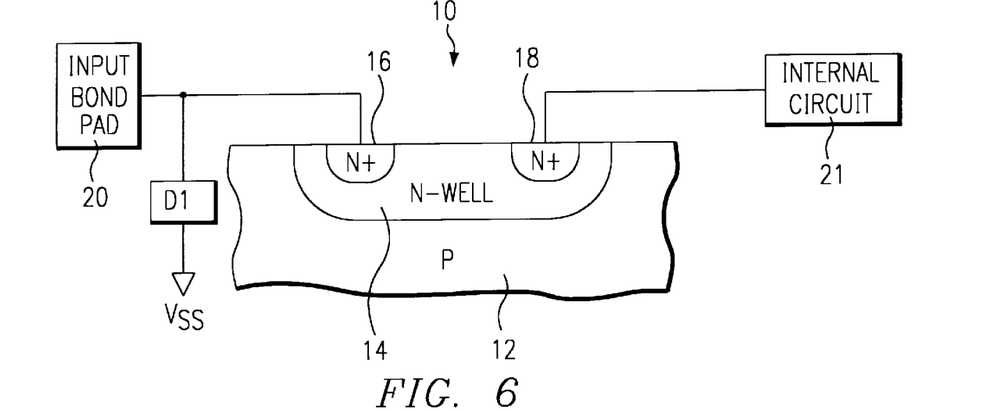
FIG. 6 is a side view schematic diagram of FIG. 2 including a primary discharge device.

Each of the devices of FIGS. 2–5 may also include a primary discharge device D1 electrically connected to input bond pad 20 and to Region 16. As an example, FIG. 6 shows a primary discharge device electrically connected to the input bond pad 20 and to Region 16 of the device of FIG. 2. A secondary discharge device D2 may also be electrically connected to region 18 and to internal circuit 21. As an example, FIG. 7 shows the device of FIG. 6 including a secondary discharge device D2.

Figure 2:
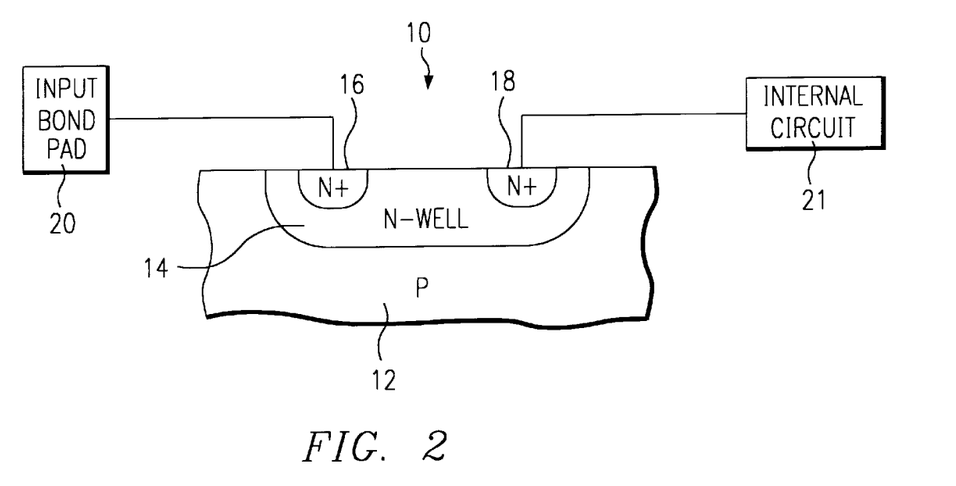
FIG. 2 is a side view schematic diagram of one embodiment of the present invention.
Figure 8:
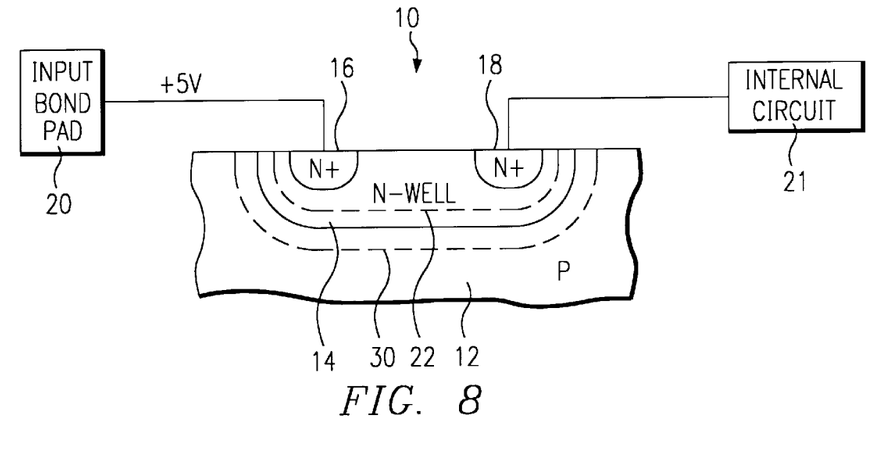
FIG. 8 is the side view schematic diagram of FIG. 2 having a low input voltage.
Figure 9:
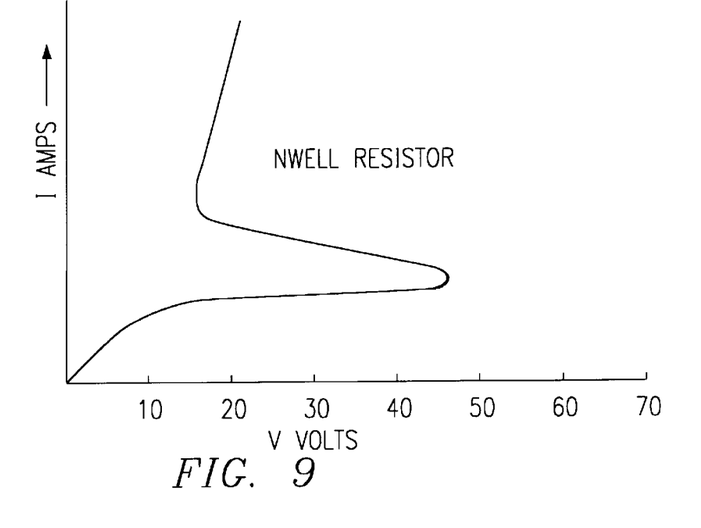
FIG. 9 is a graph depicting the snap back voltage of the device of FIG. 2.

FIG. 8 is the device of FIG. 2 with primary protection circuit D1 and heavily doped region 16 biased at 5 volts. At 5 volts, an N-well depletion edge 22 is formed within N-well 14 and a P-well depletion edge 30 is formed within substrate 12. Depletion edge 22 defines the boundary of the depletion region. In the range of 0–10 volts, N-well isolation resistor 10 displays a linear slope of voltage to current, as shown in FIG. 9. In the range of 15–20 volts, N-well isolation resistor 10 starts to roll over with current I remaining the same as voltage V increases. Current remains the same because the resistance of N-well isolation resistor 10 increases with the increase in voltage and the N-well depletion region retracts toward heavily doped region 16. The resulting current and voltage characteristic, shown in FIG. 9, is a velocity saturation effect. The velocity saturation effect causes a constant current region similar to the constant current regions in MOS devices. At some point, however, the electric field between heavily doped regions 16 and 18 will reach a critical point where the resistance value of N-well isolation resistor 10 snaps back to a constant value. This is also shown in FIG. 9 where the snap back voltage $V_{SB}$ is reached at about 45 volts. Thereafter, N-well isolation resistor 10 will act like an NPN device. The resulting N-well depletion edge 22, P-well depletion edge 30 and current to voltage characteristics of the devices of FIGS. 3–5 (not shown) are similar to those for the device of FIG. 2.

The snap back voltage $V_{SB}$ is a function of the distance between regions 16 and 18. Closing the distance between the two heavily doped regions lowers the snap back voltage. Conversely, increasing the distance between the two heavily doped regions raises the snap back voltage. For example, in one embodiment of the invention, a snap back voltage of 10 volts is realized with a distance of 2 microns between regions 16 and 18. In another embodiment, a snap back voltage of 45 volts is realized with a distance of 8 microns between the heavily doped regions. In any event, the snap back must not occur before primary protective device D1 is activated or damage may result to the internal circuit 21.

Figure 7:
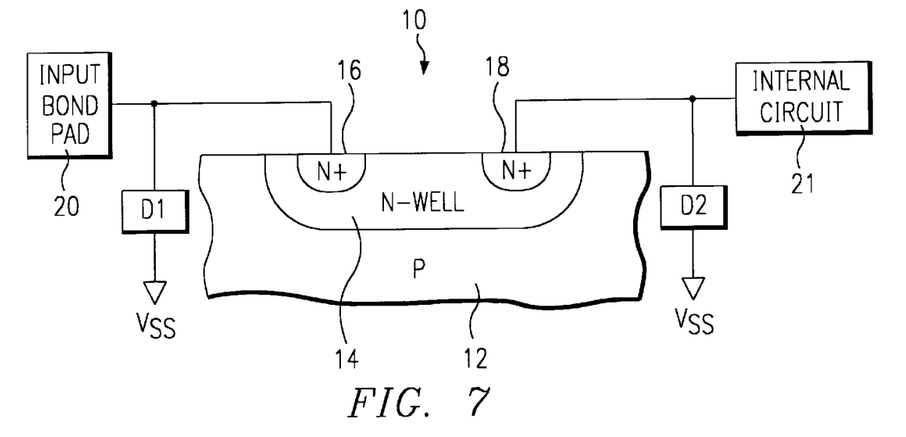
FIG. 7 is a side view schematic diagram of FIG. 6 including a primary discharge device.
Figure 10:
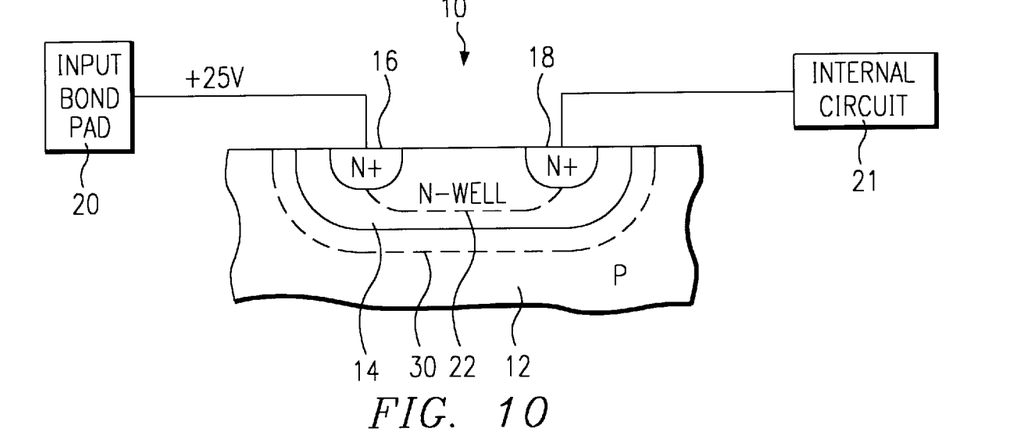
FIG. 10 is the side view schematic diagram of FIG. 2 having a high input voltage.

FIG. 10 shows the circuit of FIG. 7 experiencing an electrostatic discharge voltage of 25 volts. N-well depletion edge 22 retracts around heavily doped regions 16 and 18.

Figure 11:
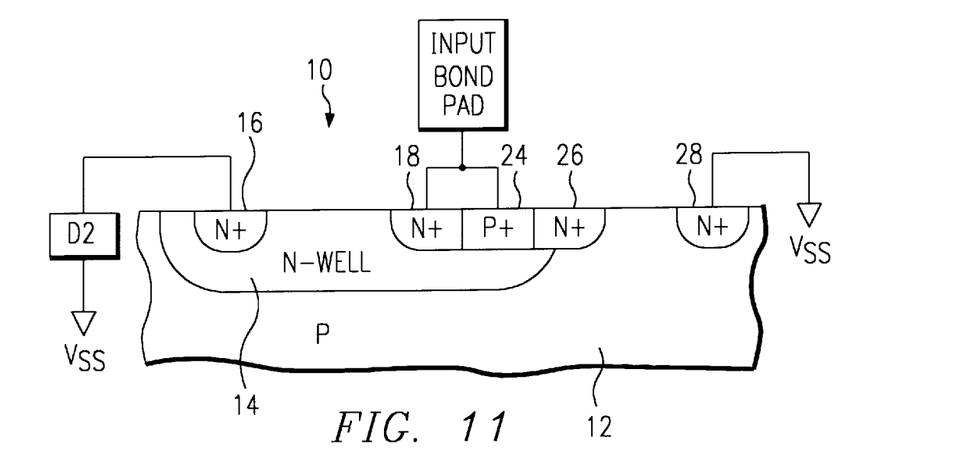
FIG. 11 is a side view schematic diagram of yet another embodiment of the present invention.
Figure 12:
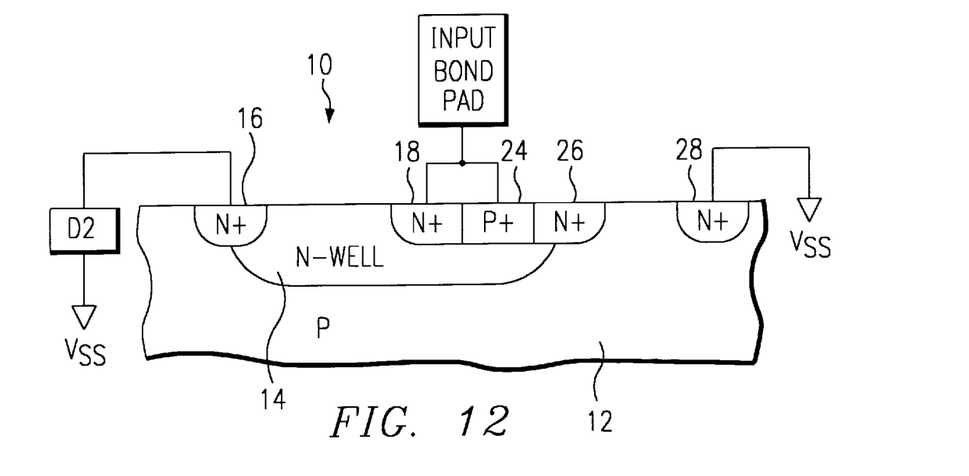
FIG. 12 is a side view schematic diagram of still yet another embodiment of the present invention.

In another embodiment of the invention, an N-well depletion resistor is utilized in a two stage input protection circuit in combination with a silicon controlled rectifier SCR as the primary protection device D1, as shown in FIGS. 11 and 12. N-well isolation resistor 10 is formed in a semiconductor substrate 12 which is lightly doped P-type. Lightly doped N-well 14 is formed in substrate 12. A heavily doped N-type region 16 is formed within N-well 14 in FIG. 11 and at the intersection of N-well 14 and substrate 12 in FIG. 12. In FIGS. 11 and 12, a heavily doped N-type region 18 is formed in N-well 14, region 18 being laterally spaced from region 16. A heavily doped P-type region 24 is formed in N-well 14 adjacent region 18 opposite region 16. A heavily doped N-type region 26 is formed adjacent region 24 at the interface between N-well 14 and P substrate 12. A heavily doped N-type region 28 is formed in P substrate 12, region 28 being spaced from region 26. Regions 18 and 24 are electrically connected to an input bond pad 20. Region 16 is electrically connected to secondary protective device D2. Region 28 is electrically connected to Vss.

Figure 13:
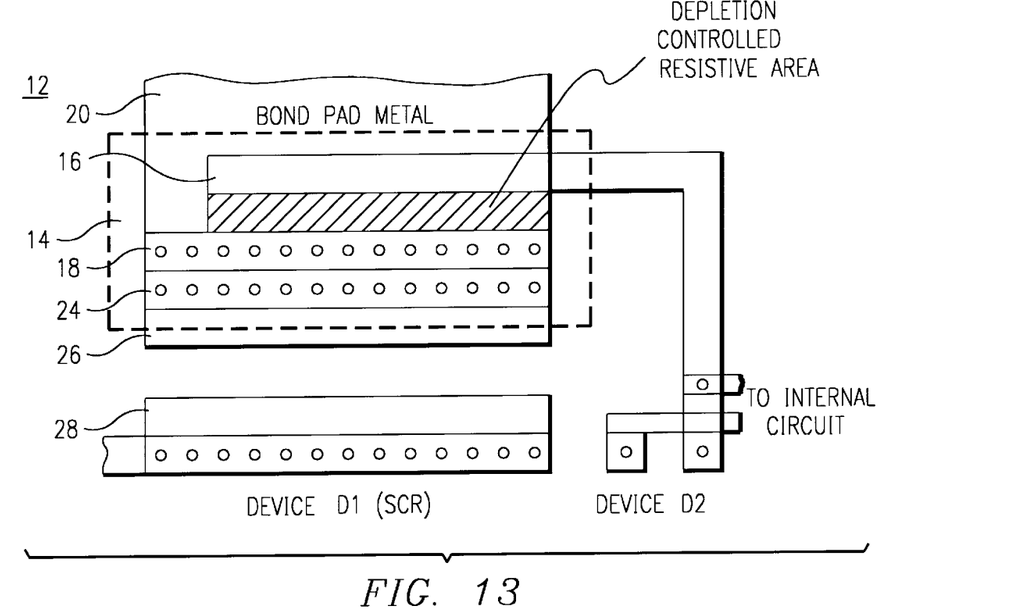
FIG. 13 is a plan view diagram of the embodiment of FIG. 11.
Figure 14:
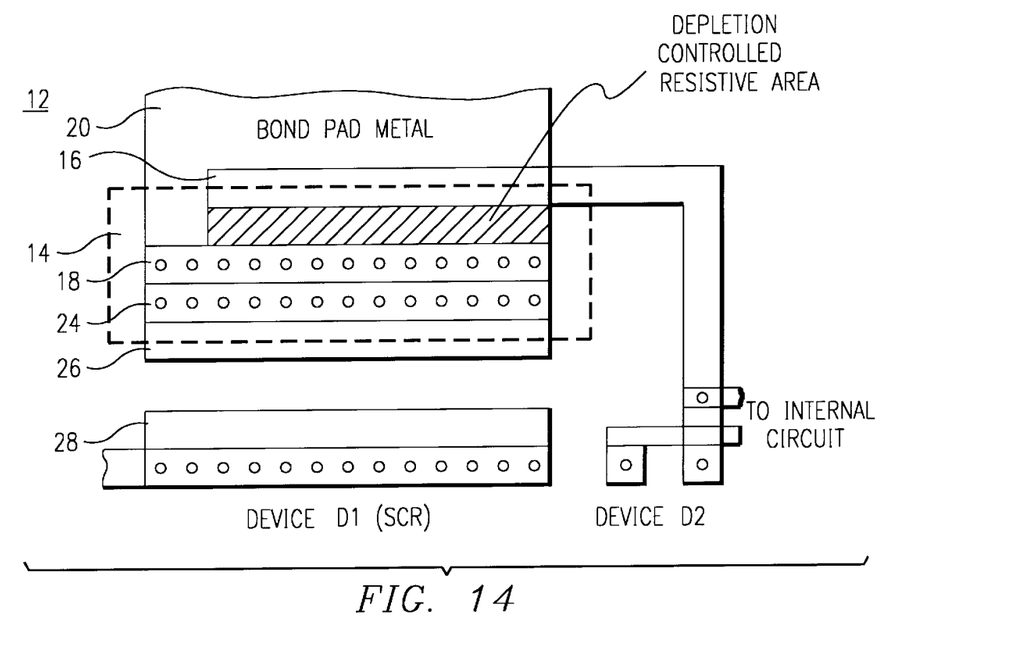
FIG. 14 is a plan view diagram of the embodiment of FIG. 12.

FIG. 13 is a layout diagram of one method of laying out the over-voltage protection device of FIG. 11 and FIG. 14 is a layout diagram of one method of laying out the over-voltage protection device of FIG. 12. In FIGS. 13 and 14, bond pad 20 is connected through the vias (represented as dots) to N+ region 18 and P+ region 24. The resistance of the depletion controlled resistor is provided by the resistive nature of lightly doped N-well between N+ regions 16 and 18. Doped regions of the over-voltage protection device may be advantageously formed in substrate 12 using masking and ion implantation techniques which are well known in the art. On the other hand, other doping techniques may be used, such as diffusion from a solid source. N-well 14 is formed at the same time the N-wells for P type field effect transistors are formed on the integrated circuit containing the over-voltage protection device. N+ regions 16, 18, 26 and 28 are formed at the time N-channel source/drain formation is performed for forming N-channel transistors on the integrated circuit. P+ region 24 is formed at the time the source/drain formation is conducted for P-channel transistors for the other components of the integrated circuit. P+ region 24 is the anode of the SCR and N+ region 28 is the cathode. Therefore, the embodiments of FIGS. 2–7 and 11–12 are completely compatible with CMOS fabrication processes.

Figure 15:
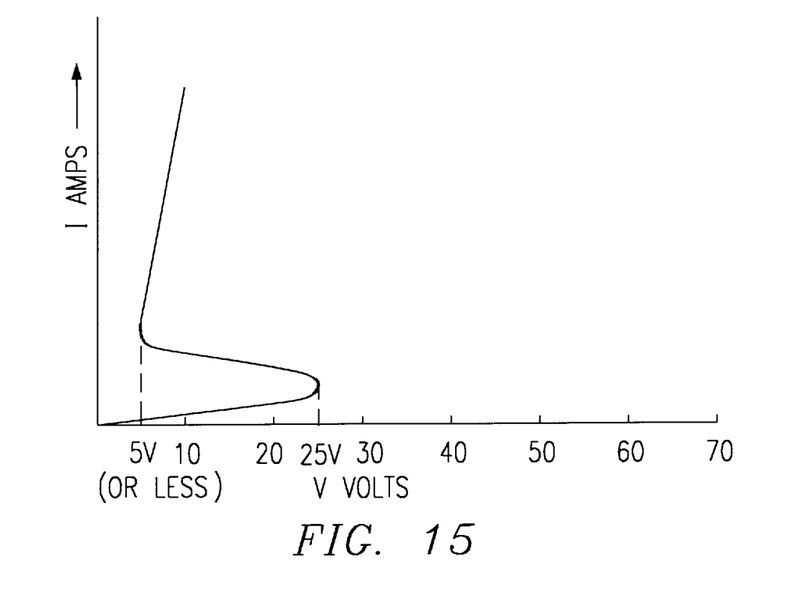
FIG. 15 is a graph depicting the triggering voltage of the device of FIGS. 11 and 12.

FIG. 15 is a graph showing the current to voltage characteristic between bond pad 20 and ground for the over-voltage protection device shown in FIG. 11 and 12. As can clearly be seen from the graph, the over-voltage protection device begins to conduct current within the range of 20–30 volts.

Figure 16:
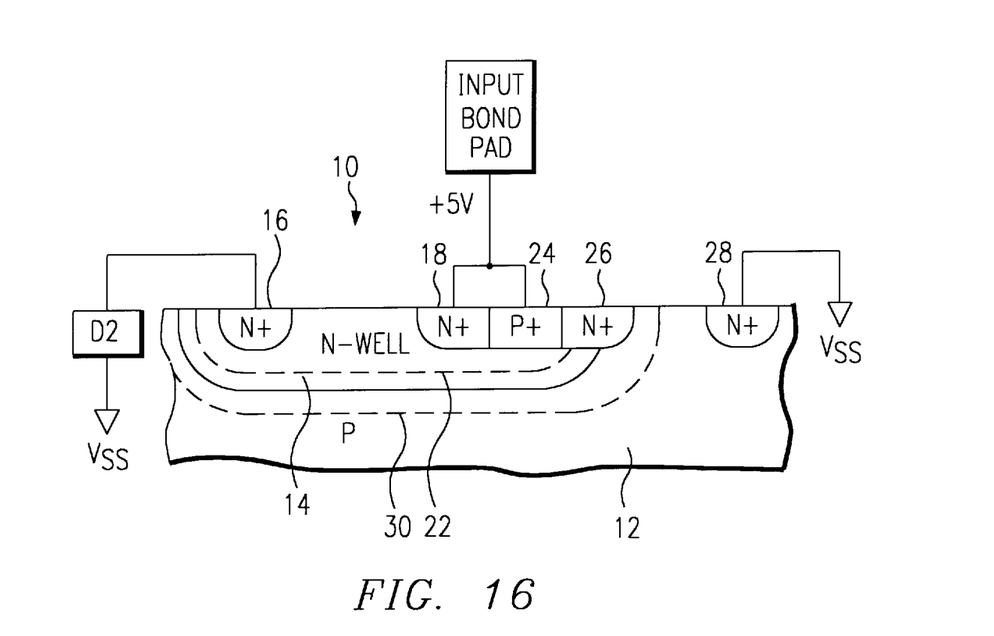
FIG. 16 is a side view schematic diagram of FIG. 11 having a low input voltage.
Figure 17:
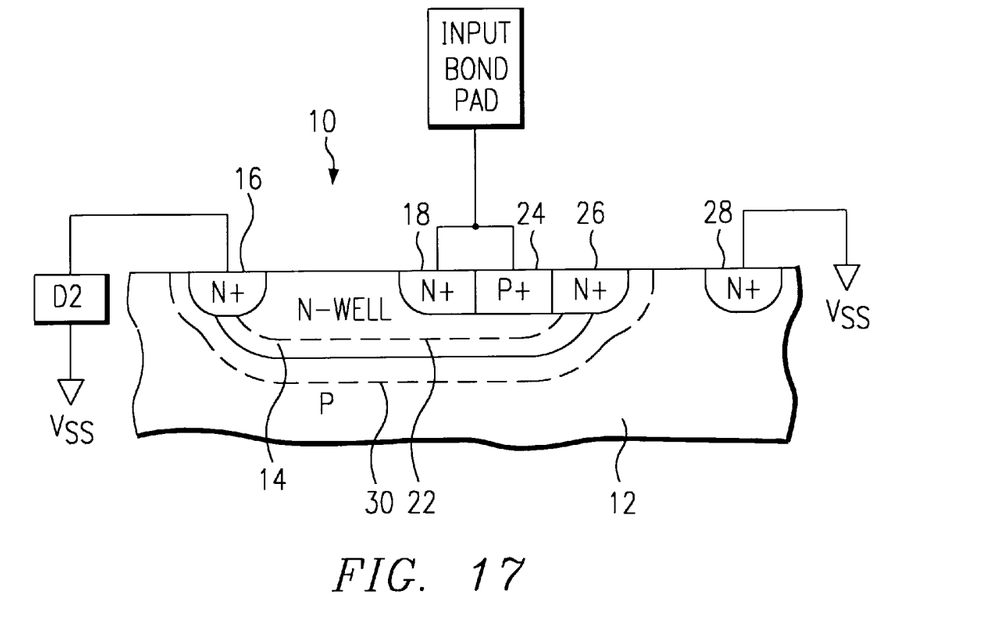
FIG. 17 is a side view schematic diagram of FIG. 12 having a low input voltage.
Figure 18:
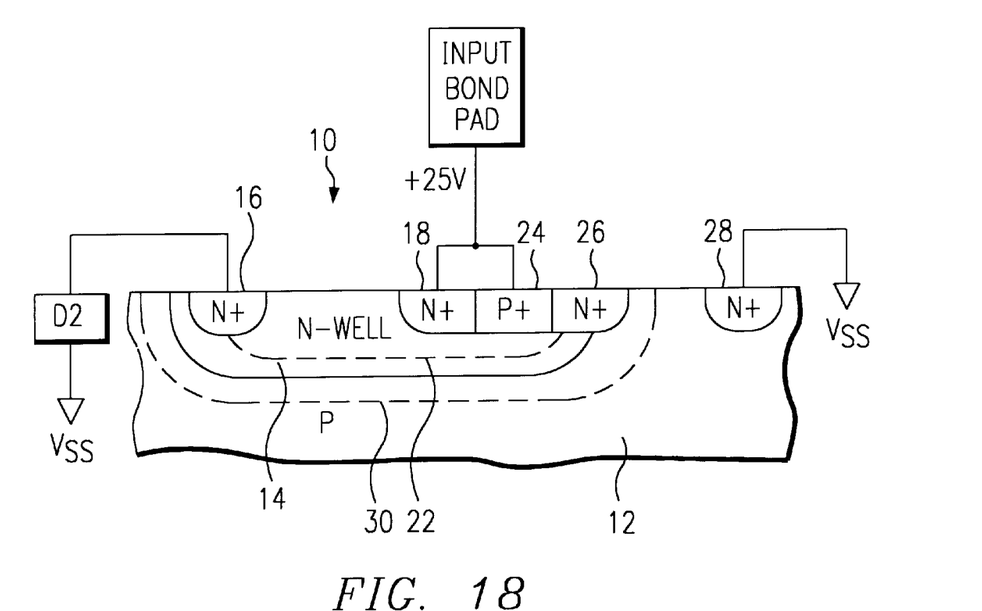
FIG. 18 is a side view schematic diagram of FIG. 11 having a high input voltage.
Figure 19:
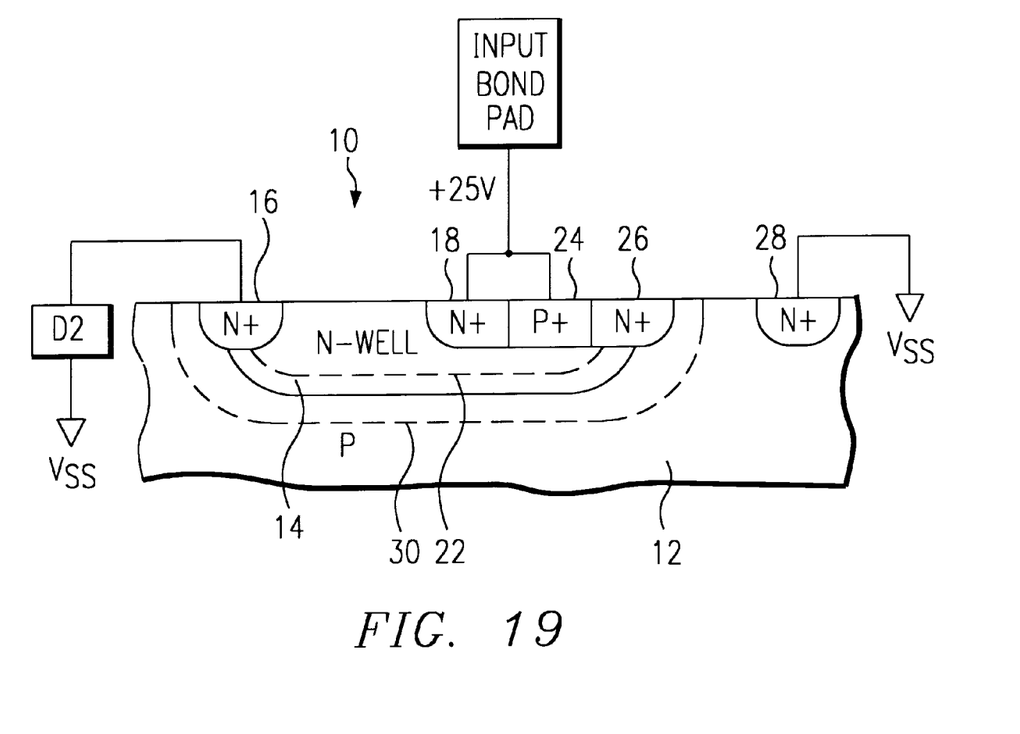
FIG. 19 is a side view schematic diagram of FIG. 12 having a high input voltage.

FIG. 16 is the device of FIG. 11, and FIG. 17 is the device of FIG. 12, showing N-well depletion edge 22 and P-well depletion edge 30 at an input voltage of 5 volts. FIGS. 18 and 19 are the devices of FIGS. 16 and 17, respectively, showing N-well depletion edge 22 and P-well depletion edge 30 at an input voltage of 25 volts.

While specific embodiments of the present invention are disclosed herein, they are not to be construed in a limiting sense. For example, the described embodiments provide over-voltage protection for positive over-voltage situations. It is clearly within the scope of the invention that changed doping polarities will provide over-voltage protection for opposite polarities. In addition, the described embodiments are utilized in conjunction with integrated circuitry. The present invention is not limited to integrated circuitry in any way and may advantageously provide over-voltage protection for discrete type devices. It is therefore contemplated that the appended claims will cover any such modifications or embodiments as fall within the true scope of the invention.

We claim:

1. An isolation stage de vice for protecting a circuit structure against over-voltage conditions, comprising:
   - a lightly doped region having a first conductivity type formed in a lightly doped substrate having a second conductivity type;
   - a first heavily doped region formed at an intersection of said substrate and said lightly doped region having said first conductivity type, said first heavily doped region being electrically connected to a first input node;
   - a second heavily doped region formed at least partially in said lightly doped region having said first conductivity type, said second heavily doped region being electrically connected to said circuit structure; and
   - a resistive means being electrically connected between said first heavily doped region and said second heavily doped region having a resistance responsive to the voltage between said first heavily doped region and said second heavily doped region.

2. An isolation stage device for protecting a circuit structure against over-voltage conditions, comprising:
   - a lightly doped region having a first conductivity type formed in a lightly doped substrate having a second conductivity type;
   - a first heavily doped region formed at least partially in said lightly doped region having said first conductivity type, said first heavily doped region being electrically connected to a first input node;
   - a primary discharge device being electrically connected to said first heavily doped region;
   - a second heavily doped region formed at least partially in said lightly doped region having said first conductivity type, said second heavily doped region being electrically connected to said circuit structure;
   - a secondary discharge device being electrically connected to said second heavily doped region; and
   - a resistive means being electrically connected between said first heavily doped region and said second heavily doped region having a resistance responsive to the voltage between said first heavily doped region and said second heavily doped region.

3. An integrated circuit device, comprising:
   - a bond pad;
   - a lightly doped region having a first conductivity type formed in a lightly doped substrate having a second conductivity type;
   - a first heavily doped region having said first conductivity type formed at least partially in said lightly doped region, said first heavily doped region being electrically connected to said bond pad;
   - a primary discharge device being electrically connected to said first heavily doped region;
   - a second heavily doped region having said first conductivity type formed in said lightly doped region, said second heavily doped region being electrically connected to said circuit structure;
   - a secondary discharge device being electrically connected to said second heavily doped region; and
   - a resistive means being electrically connected between said first heavily doped region and said second heavily doped region and having a resistance responsive to the voltage between said first heavily doped region and said second heavily doped region.

4. An integrated circuit, comprising:
   - a bond pad;
   - an internal circuit;
   - a lightly doped region having a first conductivity type formed in a lightly doped substrate having a second conductivity type, said lightly doped region comprising a resistive region;
   - a first heavily doped region having said first conductivity type formed at least partially in said lightly doped region, said first heavily doped region being electrically connected to said bond pad;
   - a primary device being electrically connected between said bond pad and a reference terminal;
   - a second heavily doped region having said first conductivity type formed at least partially in said lightly doped region, said second heavily doped region being electrically connected to said internal circuit, wherein said resistive region substantially determines a resistance between said first heavily doped region and said second heavily doped region; and
   - a secondary device being electrically connected between said second heavily doped region and said reference terminal.

5. An integrated circuit as in claim 4, wherein said primary device is a silicon controlled rectifier.

6. An integrated circuit as in claim 4, wherein said lightly doped region comprises an N-well region.

7. An integrated circuit as in claim 4, wherein each of said first and second heavily doped regions are elongated regions being spaced apart, said first heavily doped region being parallel to said second heavily doped region.

8. An integrated circuit as in claim 7, further comprising a third heavily doped formed at an intersection of said substrate and said lightly doped region having said first conductivity type, said third heavily doped region being elongated and spaced apart from said first heavily doped region and opposite said second heavily doped region, said third heavily doped region being parallel to said first heavily doped region.

9. An integrated circuit as in claim 8, further comprising a fourth heavily doped region having the second conductivity type and being electrically connected to said first heavily doped region, said fourth heavily doped region being elongated and formed between said first and third heavily doped regions.

10. An integrated circuit as in claim 4, wherein said primary device is a diode.

11. An integrated circuit as in claim 4, wherein said secondary device is a diode.

* * * * *